(12) United States Patent
Tseng et al.

(10) Patent No.: US 12,514,036 B2
(45) Date of Patent: Dec. 30, 2025

(54) LIGHT EMITTING DEVICE AND LIGHT EMITTING APPARATUS HAVING THE SAME

(71) Applicant: XIAMEN SAN'AN OPTOELECTRONICS CO., LTD., Xiamen (CN)

(72) Inventors: Ming-Chun Tseng, Xiamen (CN); Kang-Wei Peng, Xiamen (CN); Su-Hui Lin, Xiamen (CN); Chung-Ying Chang, Xiamen (CN)

(73) Assignee: XIAMEN SAN'AN OPTOELECTRONICS CO., LTD., Xiamen (CN)

( * ) Notice: Subject to any disclaimer, the term of this patent is extended or adjusted under 35 U.S.C. 154(b) by 404 days.

(21) Appl. No.: 18/174,386

(22) Filed: Feb. 24, 2023

(65) Prior Publication Data

US 2023/0317888 A1  Oct. 5, 2023

(30) Foreign Application Priority Data

Apr. 2, 2022  (CN) .......................... 202210351058.5

(51) Int. Cl.
*H10H 20/841*  (2025.01)
*H10H 20/831*  (2025.01)

(52) U.S. Cl.
CPC ........ *H10H 20/841* (2025.01); *H10H 20/831* (2025.01)

(58) Field of Classification Search
CPC .. H10H 20/032; H10H 20/034; H10H 20/819; H10H 20/831; H10H 20/84; H10H 20/841; H10H 20/857; H01L 33/46; H01L 33/38
See application file for complete search history.

(56) References Cited

U.S. PATENT DOCUMENTS

| | | | |
|---|---|---|---|
| 2023/0068872 A1* | 3/2023 | Kuo | H10H 20/819 |
| 2023/0077761 A1* | 3/2023 | Chang | H10H 20/8162 257/98 |
| 2023/0343903 A1* | 10/2023 | Wang | H10H 20/841 |

FOREIGN PATENT DOCUMENTS

| | | | | |
|---|---|---|---|---|
| CN | 109659414 B | * | 6/2021 | .......... H01L 33/145 |
| CN | 114824026 A | * | 7/2022 | ............. H01L 33/38 |
| WO | WO-2022164760 A1 | * | 8/2022 | ............. G03B 27/72 |
| WO | WO-2023063457 A1 | * | 4/2023 | ............. C09J 11/04 |

* cited by examiner

*Primary Examiner* — Walter L Lindsay, Jr.
(74) *Attorney, Agent, or Firm* — MUNCY, GEISSLER, OLDS & LOWE, P.C.

(57) ABSTRACT

A light emitting device includes a semiconductor stack, and an insulating layer partially covering the semiconductor stack. The semiconductor stack includes a first conductivity type semiconductor layer, a light emitting layer and a second conductivity type semiconductor layer that are stacked in sequence. A reflective layer is disposed in the insulating layer, and includes a metal reflective layer and an anti-oxidation layer stacked one on top of the other. A light emitting apparatus is also disclosed.

19 Claims, 9 Drawing Sheets

LIGHT EMITTING DEVICE AND LIGHT EMITTING APPARATUS HAVING THE SAME

CROSS-REFERENCE TO RELATED APPLICATION

This application claims priority to Chinese Invention Patent Application No. 202210351058.5, filed on Apr. 2, 2022, which is incorporated herein by reference in its entirety.

FIELD

The disclosure relates to the technical field of a semiconductor optoelectronic device, and more particularly to a light emitting device and a light emitting apparatus having the same.

BACKGROUND

A light emitting diode (LED) includes different light emitting materials and light emitting components, and is a solid state semiconductor light emitting element. It is widely used in various fields, such as lighting, visible light communication and light emitting display due to its advantages of low cost, low power consumption, high luminous efficiency, small size, energy saving and environmental protection, and good photoelectric characteristics.

SUMMARY

Therefore, an object of the present disclosure is to provide a light emitting device with high reliability.

According to one aspect of this disclosure, the light emitting device includes a semiconductor stack, an insulating layer partially covering the semiconductor stack, and a reflective layer disposed in the insulating layer. The semiconductor stack includes a first conductivity type semiconductor layer, a light emitting layer and a second conductivity type semiconductor layer that are stacked in sequence. The reflective layer includes a metal reflective layer and an anti-oxidation layer stacked one on top of the other.

Another object of this disclosure is to provide a light emitting apparatus having the above light emitting device.

According to another aspect of this disclosure, the light emitting apparatus includes the above light emitting device.

BRIEF DESCRIPTION OF THE DRAWINGS

Other features and advantages of the disclosure will become apparent in the following detailed description of the embodiments with reference to the accompanying drawings. It is noted that various features may not be drawn to scale.

DETAILED DESCRIPTION

Figure 1:
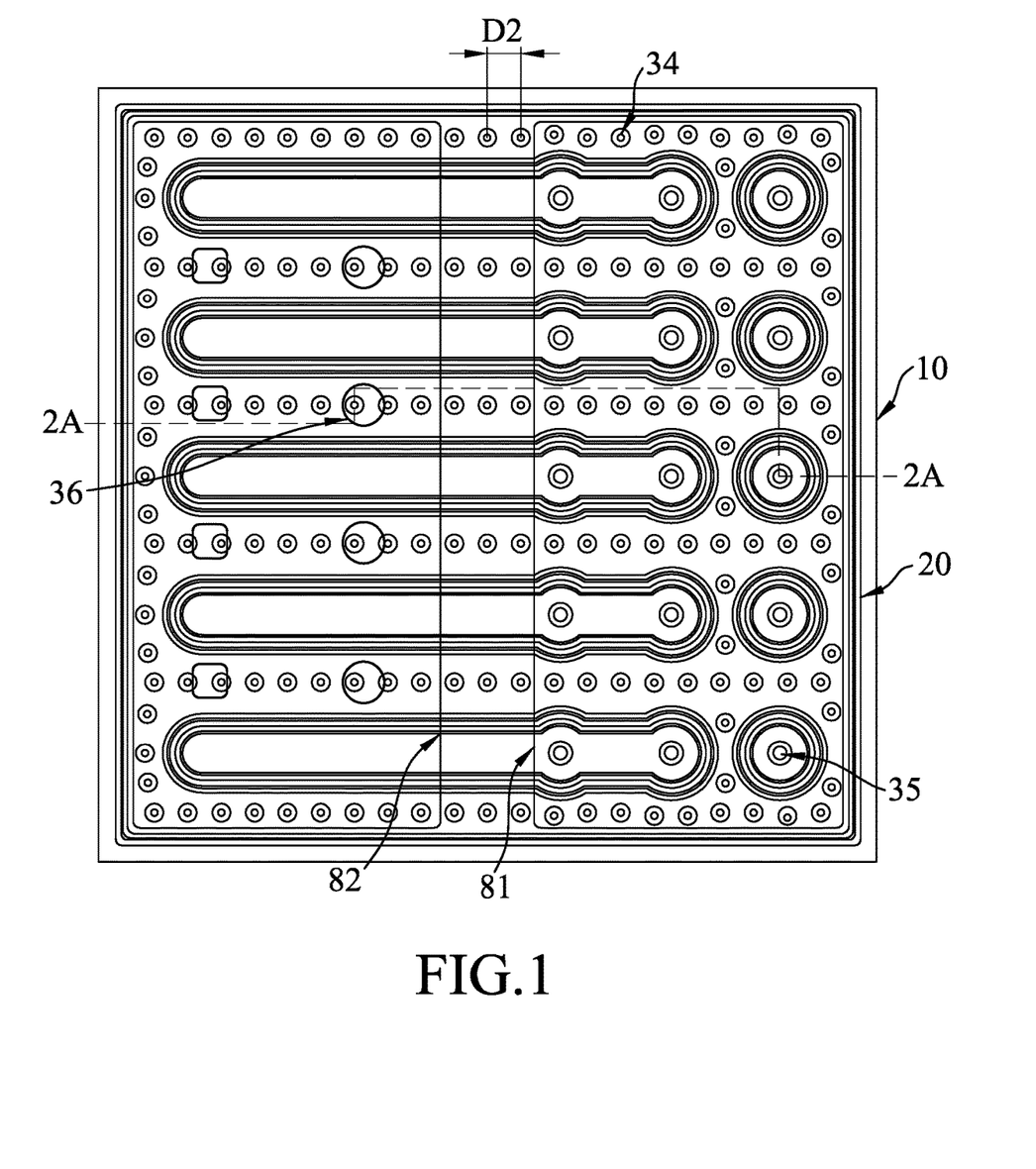
FIG. 1 is a top view of a light emitting device according to an embodiment of the present disclosure.
Figure 2A:
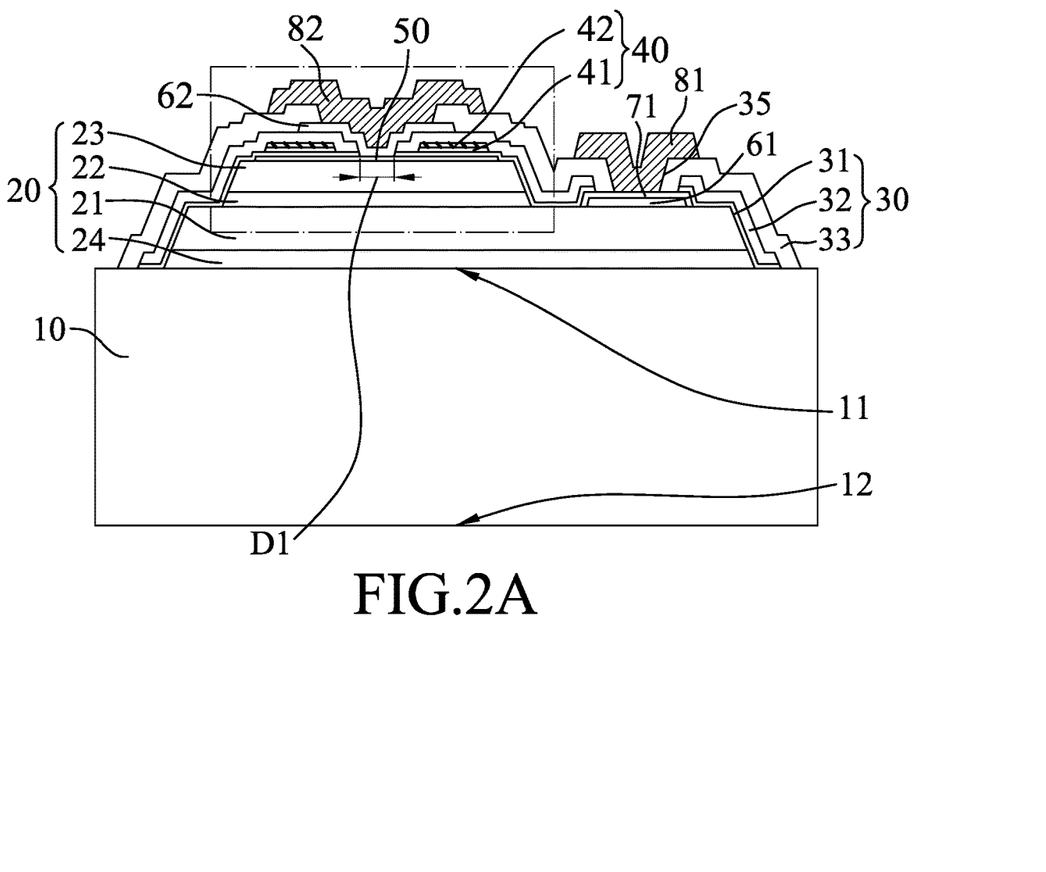
FIG. 2A is a schematic sectional side view of the light emitting device of the embodiment shown in FIG. 1.

FIG. 1 is a top view of a light emitting device according to an embodiment of the present disclosure; FIG. 2A is a schematic sectional side view of the light emitting device of the embodiment shown in FIG. 1; and, FIG. 2B is an enlarged schematic view of a structure in dotted rectangle in FIG. 2A.

Figure 2B:
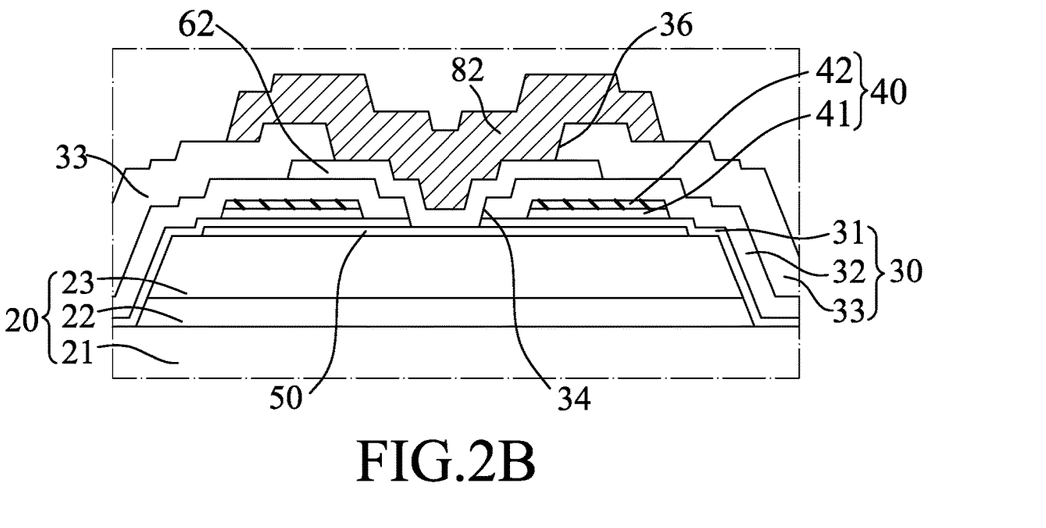
FIG. 2B is an enlarged schematic view of a structure in dotted rectangle in FIG. 2A.

With reference to FIGS. 1, 2A and 2B, the light emitting device of the embodiment includes a substrate 10, a semiconductor stack 20, an insulating layer 30 and a reflective layer 40.

The semiconductor stack 20 is disposed on the substrate 10. The substrate 10 may be transparent, non-transparent or translucent, and has opposite upper surface 11 and lower surface 12. If the substrate 10 is transparent or translucent, light radiated from the semiconductor stack 20 is allowed to pass through the upper surface 11 to reach the lower surface 12 which is away from the semiconductor stack 20. The substrate 10 may be a growth substrate which is used to grow the semiconductor stack 20 and which includes a sapphire substrate, a silicon nitride substrate, a silicon substrate, a gallium nitride substrate, an aluminum nitride substrate, etc., but is not limited thereto. The thickness of the substrate 10 preferably does not exceed the length of a short side of the substrate 10. In some embodiments, the thickness of the substrate 10 may be not greater than 300 μm, for example, 200 μm, 100 μm or 80 μm. Further, in some embodiments, the substrate 10 may be thinned or removed to form a thin-film product. In some embodiments, in order to enhance a light extraction efficiency of the substrate 10, the thickness of the substrate 10 may be appropriately increased, and the thickness may be increased from 200 μm to 900 μm, for example, 250 μm to 400 μm, 400 μm to 550 μm, or 550 μm to 750 μm.

The substrate 10 may include an uneven structure (not shown) formed on at least a portion or area of the upper surface 11. The uneven structure can improve an external light extraction efficiency and crystallinity of semiconductor layers constituting the semiconductor stack 20, and may include a plurality of protrusions each of which has, for example, a dome-like convex shape, or other various shapes, such as a platform, a cone, a triangle, a hexagon, a cone-like, a triangular-like, or a hexagonal-like shape, or combinations thereof. Furthermore, the uneven structure may be optionally formed at various areas, such as the lower surface 12 of the substrate 10 for improving the light extraction efficiency thereof, or may be omitted. In some embodiments, the material of the uneven structure may be the same as or different from that of the substrate 10. The refractive index of the uneven structure may be lower than that of the substrate 10 which is conducive for improving the light extraction efficiency of the light emitting device. In some embodiments, the uneven structure may also be a multilayer structure having different material layers, and different material layers have different refractive indices, a detailed description thereof is omitted herein.

The semiconductor stack 20 includes a first conductivity type semiconductor layer 21, a light emitting layer 22 and a second conductivity type semiconductor layer 23 that are stacked in sequence on the substrate 10. The material of the semiconductor stack 20 includes III-V semiconductor materials of $Al_xIn_yGa_{(1-x-y)}N$ or $Al_xIn_yGa_{(1-x-y)}P$, where $0 \le x, y \le 1$ and $x+y \le 1$. According to the material of the light emitting layer 22, when the material of the semiconductor stack 20 is AlInGaP-based material, a red light with a wavelength ranging between 610 nm and 650 nm or a yellow light with a wavelength ranging between 550 nm and 570 nm can be emitted. When the material of the semiconductor stack 20 is InGaN-based material, a blue or deep blue light with a wavelength ranging between 420 nm and 490 nm or a green light with a wavelength ranging between 490 nm and 550 nm can be emitted. When the material of the semiconductor stack 20 is AlGaN-based material, a UV light with a wavelength ranging between 190 nm and 420 nm can be emitted.

The light emitting layer 22 may be a single heterostructure (SH), a double heterostructure (DH), a double-side double heterostructure (DDH), or a multi-quantum well (MQW). The material of the light emitting layer 22 can be i-type, p-type or n-type semiconductor. In one embodiment, the light emitting layer 22 emits ultraviolet rays, and has well layers and barrier layers. The number of each of the well layers and barrier layers may range from, for example, 1 to 10. Each of the well layer and the barrier layer is, for example, an AlGaN layer, but the Al composition of the well layer is lower than that of the barrier layer.

The second conductivity type semiconductor layer 23 is, for example, a p-type AlGaN or a p-type GaN layer, or a layered unit formed by sequentially stacking p-type AlGaN layer(s) and p-type GaN layer(s). In certain embodiments, the second conductivity type semiconductor layer 23 includes the p-type GaN layer, the thickness of which ranges from 5 nm to 50 nm. By providing the thin-film GaN, the light emitting device may have desired internal quantum luminous efficiency and external quantum luminous efficiency. Specifically, the p-type GaN layer within this thickness range is conducive to the lateral current spreading effect of the p-side current without causing excessive light absorption.

Before forming the first conductivity type semiconductor layer 21, a buffer layer 24 may be formed on the upper surface 11 of the substrate 10 for improving the lattice mismatch between the substrate 10 and the semiconductor stack 20. The buffer layer 24 may be composed of a nitride-based material. In one embodiment, a layer of aluminum nitride may be formed on the upper surface 11 of the substrate 10 to serve as a bottom layer (not shown). The bottom layer is in contact with the upper surface 11 of the substrate 10, and has a thickness of preferably not greater than 1 µm. Further, the aluminum nitride bottom layer may include a low-temperature layer, an intermediate layer and a high-temperature layer sequentially arranged on the substrate 10, so that the semiconductor layers of the semiconductor stack 20 with excellent crystallinity may be grown. In other embodiments, the aluminum nitride bottom layer is formed with a plurality of holes which is conducive for releasing the stress of the semiconductor layers of the semiconductor stack 20. The holes may be elongated holes extending along the thickness of the aluminum nitride bottom layer, and the depth of each of the holes may be, for example, ranging from 0.5 µm to 1.5 µm.

It should be pointed out that the light emitting device of this disclosure is not limited to include only one semiconductor stack 20, and may include a plurality of semiconductor stacks 20 arranged on the substrate 10. A conductive structure may be provided among the semiconductor stacks 20, so that the semiconductor stacks 20 can be electrically connected to each other in series, parallel, series-parallel, etc., on the substrate 10.

Optionally, a first contact layer 50 may also be provided on the semiconductor stack 20 for spreading the current, so that the current can be distributed more uniformly, the operating voltage of the light emitting device can be reduced, and the light extracting performance of the light emitting device can be improved. The first contact layer 50 may be made of a transparent conductive material, such as indium tin oxide (ITO), indium zinc oxide (IZO), indium oxide (InO), tin oxide (SnO), cadmium tin oxide (CTO), antimony tin oxide (ATO), aluminum zinc oxide (AZO), zinc tin oxide (ZTO), gallium doped zinc oxide (GZO), tungsten doped indium oxide (IWO), and zinc oxide (ZnO), but is not limited thereto.

The thickness of the first contact layer 50 is generally not limited, and may be in the range of about 50 Å to 3000 Å, i.e., 50 Å to 1500 Å. If the first contact layer 50 is too thick, light passing through the first contact layer 50 will be absorbed and lost. Therefore, the thickness of the first contact layer 50 is preferably limited to not greater than 3000 Å.

The insulating layer 30 covers at least a portion of the semiconductor stack 20, and includes a first insulating layer 31 and a second insulating layer 32. Each of the first and second insulating layers 31, 32 can be made of a low refractive index material, such as silicon dioxide ($SiO_2$), aluminum oxide ($Al_2O_3$), silicon oxynitride (SiON), or magnesium fluoride ($MgF_2$). Alternatively, each of the first and second insulating layers 31, 32 may also be made of a high refractive index material, such as titanium oxide ($TiO_2$), niobium oxide ($Nb_2O_5$), tantalum oxide ($Ta_2O_5$), hafnium oxide ($HfO_2$), or zirconium oxide ($ZrO_2$). In some embodiments, if the insulating layer 30 is made of a low refractive index material, the light extraction efficiency can be improved by the difference in refractive index between the insulating layer 30 and the first contact layer 50. The insulating layer 30 has at least one through hole 34, so that conductive material may be formed in the through hole 34 and may be electrically connected with the semiconductor stack 20.

In order for the first insulating layer 31 to have good insulation protection and anti-leakage function, the thickness of the first insulating layer 31 may be in the range of 500 Å to 10000 Å, and the thickness of the second insulating layer 32 may be in the range of 1000 Å to 30000 Å. In some embodiments, the thickness of the second insulating layer 32 may be greater than that of the first insulating layer 31. For example, the thickness of the first insulating layer 31 is in the range of 1000 Å to 6000 Å, and the thickness of the second insulating layer 32 is in the range of 8000 Å to 15000 Å. Since the thickness of the second insulating layer 32 is greater than that of the first insulating layer 31, the reflective layer 40 (disposed on the first insulating layer 31 in this embodiment) may be completely covered to form electrical insulation. The insulating layer 30 may avoid the problem of migration of metal elements caused by electrical conduction, and may provide more excellent waterproof, anti-oxidation, and light reflection effects, so as to effectively reduce the intrusion of water vapor which can lead to failure of the light emitting device, thereby improving the reliability and luminous efficiency of the light emitting device of this disclosure.

The reflective layer 40 is disposed in the insulating layer 30, and includes a metal reflective layer 41 and an anti-oxidation layer 42 stacked one on top of the other in such order on the semiconductor stack 20. With reference to FIGS. 2A and 2B, in this embodiment, a lower surface of the metal reflective layer 41 (which serves as a lower surface of the reflective layer 40) is in contact with the first insulating layer 31, and an upper surface of the anti-oxidation layer 42 (which serves as an upper surface of the reflective layer 40) is in contact with the second insulating layer 32. Specifically, the first insulating layer 31, the metal reflective layer 41, the anti-oxidation layer 42 and the second insulating layer 32 are sequentially arranged from bottom to top and are in contact with each other. The material of the metal reflective layer 41 may be aluminum (Al), silver (Ag), rhodium (Rh), or combinations thereof.

Moreover, in some other embodiments, an omnidirectional reflective layer (ODR) structure is formed by the first contact layer 50, the insulating layer 30 (such as low refractive index), and the metal reflective layer 41. The reflection effect of the ODR is better than that of a conventional metal reflective layer or a distributed Bragg reflective layer structure, so that the light extraction efficiency of the light emitting device of this disclosure can be effectively enhanced, and the brightness thereof can be improved.

Generally speaking, aluminum (Al), silver (Ag) or rhodium (Rh) is mostly used as a material for metal reflecting mirrors. However, because the optical power of the light emitting device will increase with the drive current, the optical power of the light output therefrom will also increase, which is in a linear relationship. When a metal material is used as a reflecting mirror, if the metal reflecting mirror is used as a conductive layer in the path of current injection, it will easily cause the migration of the metal, resulting in component failure. Thus, in this embodiment, through the sequence arrangement of the second insulating layer 32, the reflective layer 40, and the first insulating layer 31 from top to bottom, the reflective layer 40 can be completely covered by the first and second insulating layers 31, 32, so that the problem of metal migration caused by electrical conduction can be avoided, and the metal reflective layer 41 can be stably used to reflect light. Through this, not only the reliability of the light emitting device of this disclosure can be enhanced, but also the light extraction efficiency thereof can also be improved.

When the metal reflective layer 41 is plated by vapor deposition method, the metal reflective layer 41 is easy to be oxidized because the characteristic of the material of the metal reflective layer 41, especially aluminum (Al), is lively. Therefore, it is easy to cause uneven deposition of the subsequent second insulating layer 32, thereby leading to easy intrusion of water vapor and causing component failure. To overcome such drawback, in this embodiment, the anti-oxidation layer 42 is provided on an upper surface of the metal reflective layer 41. Specifically, after the vapor deposition of the metal reflective layer 41 is completed, the anti-oxidation layer 42 is deposited on the upper surface of the metal reflective layer 41 so as to effectively solve the problem of easy oxidation of the metal reflective layer 41, and can also solve the problem of the edge of the metal reflective layer 41 being lifted up and being warped during a metal lifting-off procedure which is conducted to remove excess metal on a mask pattern. When the luminous intensity LOP (light output power) test was carried out on the light emitting device having this structure, it was found that the "sandwich" structure formed by the metal reflective layer 41 and the anti-oxidation layer 42 of the reflective layer 40 can form twice reflections, and in cooperation with the structural design of the semiconductor stack 20 and the insulating layer 30, the brightness of the light emitting device can be significantly improved.

In this embodiment, the material of the anti-oxidation layer 42 contains chromium (Cr). Based on the role of the anti-oxidation layer 42 in preventing a surface of the metal reflective layer 41 from being oxidized, the thickness of the anti-oxidation layer 42 does not need to be too large. However, in order to ensure the reliability of the light emitting device of this disclosure, in some embodiments, the thickness of the anti-oxidation layer 42 may range from 10 Å to 100 Å. When the thickness of the anti-oxidation layer 42 is too large, the second insulating layer 32 covering the anti-oxidation layer 42 will have a certain risk of peeling off due to stress problem. In some embodiments, in addition to covering the upper surface of the metal reflective layer 41, the anti-oxidation layer 42 may also selectively cover part or all of side surfaces thereof. In some embodiments, a projection of the reflective layer 40 on the semiconductor stack 20 is located in the second conductivity type semiconductor layer 23 to make the light emitting device have good reliability. In an embodiment, the projection of the reflective layer 40 on the semiconductor stack 20 is located on an upper surface of the second conductivity type semiconductor layer 23. With such design, the reliability of the light emitting device of this disclosure can be further improved.

It can be understood that the insulating layer 30 may also be disposed to cover the sidewall of the semiconductor stack 20.

Referring again to FIGS. 1, 2A and 2B, the light emitting device of this disclosure further includes at least one first connecting electrode 71, at least one second contact layer 61, and at least one second connecting electrode 62. The second contact layer 61 is formed on the first conductivity type semiconductor layer 21 to electrically connect with the same. The second connecting electrode 62 is located on the second conductivity type semiconductor layer 23 to electrically connect with the same. Specifically, the insulating layer 30 has a plurality of the through holes 34 extending therethrough, and the second connecting electrode 62 extends into the through holes 34 and is electrically connected to the second conductivity type semiconductor layer 23. When the first contact layer 50 is located on the second conductivity type semiconductor layer 23, as shown in FIG. 2A, the second connecting electrode 62 is in contact with the first contact layer 50, and is electrically connected to the second conductivity type semiconductor layer 23 through the first contact layer 50. In some embodiments, the projection of the reflective layer 40 on the semiconductor stack 20 may not overlap with the through holes 34.

The material of the second contact layer 61 may be one of titanium (Ti), aluminum (Al), platinum (Pt) or gold, or an alloy of any combination thereof, or a stack of any combination thereof. The second connecting electrode 62 may exhibit current-spreading function to uniformally spread the current to the second conductivity type semiconductor layer 23, and may be made of, e.g., chromium (Cr), nickel (Ni), platinum (Pt), gold (Au) and titanium (Ti), or an alloy of any combination thereof, or a stack of any combination thereof, but not limited thereto.

In an embodiment, a diameter (D1) of each through hole 34 may range from 10 µm to 50 µm, and a distance (D2) between two adjacent ones of the through holes 34 ranges from 10 µm to 100 µm. As such, the second connecting electrode 62 can play the role of current spreading. When the value of the diameter (D1) is less than 10 µm, the contact resistance between the second connecting electrode 62 and the first contact layer 50 may increase, resulting in an increase in the forward voltage. When the value of the distance (D2) is less than 10 µm, it is difficult to reserve a large reflection area. When the value of the diameter (D1) exceeds 50 µm or the value of the distance (D2) exceeds 100 µm, it will be difficult to achieve dense distribution of the point-shaped through holes 34. As a result, uniform spreading of the current is poor, and it is difficult to achieve the effect of current spreading.

In certain embodiments, the diameter (D1) of each through hole 34 ranges from 15 µm to 35 µm, and the distance (D2) between two adjacent through holes 34 ranges from 15 µm to 35 µm. With these ranges, on one hand, the second connecting electrode 62 can achieve the effect of current spreading; on the other hand, enough reflective windows can be reserved to reduce the light absorption effect of the second connecting electrode 62 in the through holes 34. In this embodiment, the forward voltage of the light emitting device of this disclosure may be controlled within desirable range by adjusting the distance among the through holes 34.

The first connecting electrode 71 is located on the second contact layer 61. In some embodiments, the insulating layer 30 partially covers a surface of the first connecting electrode 71. The material of the first connecting electrode 71 can be one of chromium (Cr), nickel (Ni), platinum (Pt), gold (Au) and titanium (Ti), or an alloy of any combination thereof, or a stack of any combination thereof, but not limited thereto. The insulating layer 30 further includes a third insulating layer 33 which is formed on the second insulating layer 32 and which partially covers the first connecting electrode 71 and the second connecting electrode 62. The third insulating layer 33 can be made of a low refractive index material, such as silicon dioxide ($SiO_2$), aluminum oxide ($Al_2O_3$), silicon oxynitride (SiON), or magnesium fluoride ($MgF_2$); or may also be made of a high refractive index material, such as titanium oxide ($TiO_2$), niobium oxide ($Nb_2O_5$), tantalum oxide ($Ta_2O_5$), hafnium oxide ($HfO_2$), or zirconium oxide ($ZrO_2$); or may be a Bragg reflector (DBR) formed by repeated stacking of two or more materials.

The light emitting device of this disclosure further includes a first pad electrode 81 and a second pad electrode 82. The third insulating layer 33 defines a first space 35 and a second space 36. The first pad electrode 81 is disposed in the first space 35, and is electrically connected to the second contact layer 61. The second pad electrode 82 is disposed in the second space 36, and is electrically connected to the second connecting electrode 62. The material of each of the first and second pad electrodes 81, 82 may be one of titanium (Ti), aluminum (Al), nickel (Ni), gold (Au) and tin (Sn), or an alloy of any combination thereof, or a stack of any combination thereof, but not limited thereto. The first and second pad electrodes 81, 82 can be formed together by using the same material in the same process, so that they can have the same layer structure, but not limited thereto.

FIGS. 3 to 16 are sectional views illustrating the steps of a method for producing the light emitting device of the embodiment shown in FIG. 1.

Figure 3:
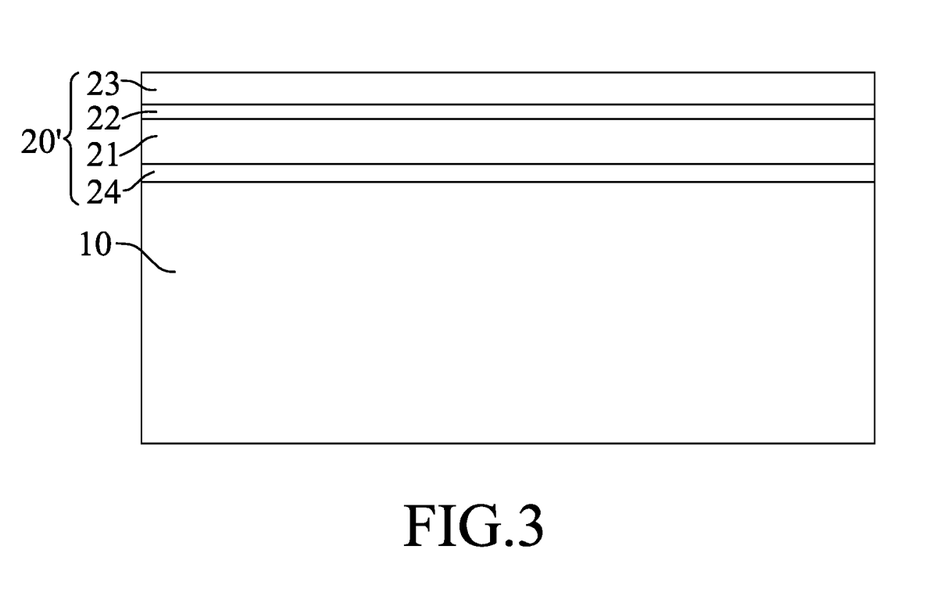
FIGS. 3 to 16 are sectional views illustrating the steps of a method for producing the light emitting device of the embodiment shown in FIG. 1.

With reference to FIG. 3, a first process step (1) is implemented, in which a semiconductor laminate 20' is formed on the substrate 10. Generally, various known methods can be used for growing the semiconductor laminate 20', such as metal organic chemical vapor deposition (MOCVD), molecular beam epitaxy (MBE), hydride vapor phase epitaxy (HVPE), and other growth technologies. The substrate 10 is a sapphire substrate, and the semiconductor laminate 20' includes the buffer layer 24, the first conductivity type semiconductor layer 21, the light emitting layer 22, and the second conductivity type semiconductor layer 23.

Figure 4:
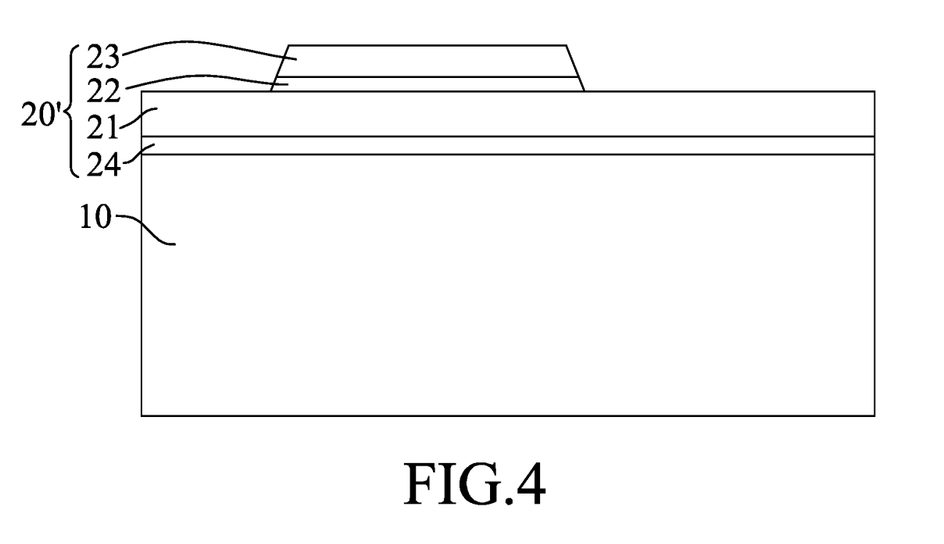

With reference to FIG. 4, a second process step (2) is then implemented, in which a mesa etching process is performed on the semiconductor laminate 20' through a photomask and by dry etching so that the light emitting layer 22 and the second conductivity type semiconductor layer 23 are partially removed to expose the first conductivity type semiconductor layer 21.

Figure 5:
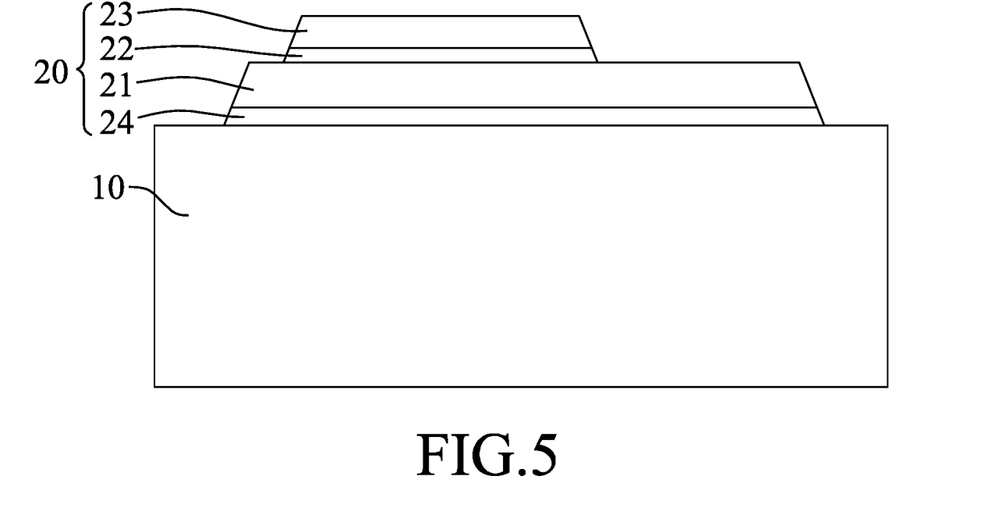

With reference to FIG. 5, a third process step (3) is implemented, in which the exposed first conductivity type semiconductor layer 21 and the underlying buffer layer 24 are etched and partially removed so as to obtain the semiconductor stack 20 as an independent single chip. In the semiconductor stack 20, a part of the first conductivity type semiconductor layer 21 is exposed from the light emitting layer 22 and the second conductivity type semiconductor layer 23 to form a mesa.

Figure 6:
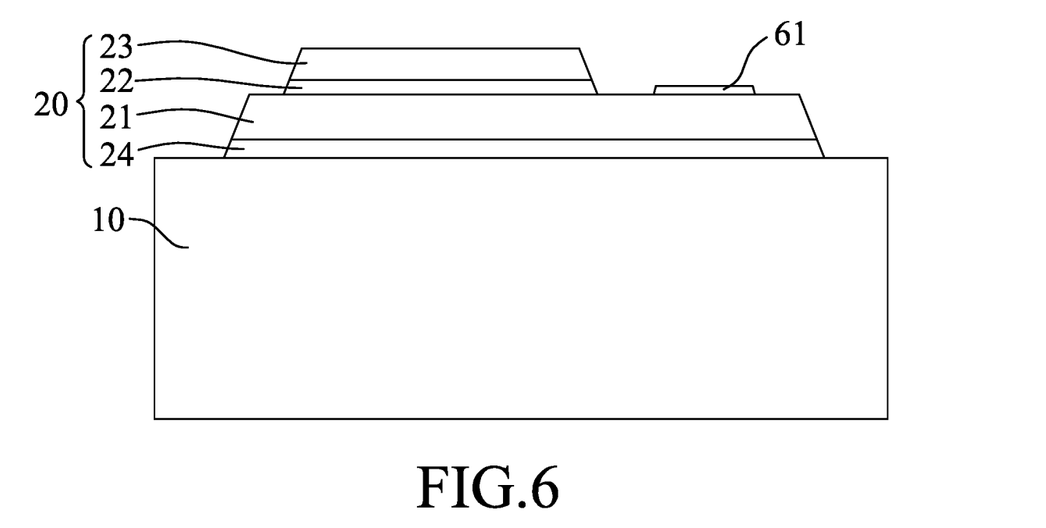

With reference to FIG. 6, a fourth process step (4) is implemented, in which the second contact layer 61 is deposited on the exposed area of the first conductivity type semiconductor layer 21, and is then annealed thereto to form an ohmic contact.

Figure 7:
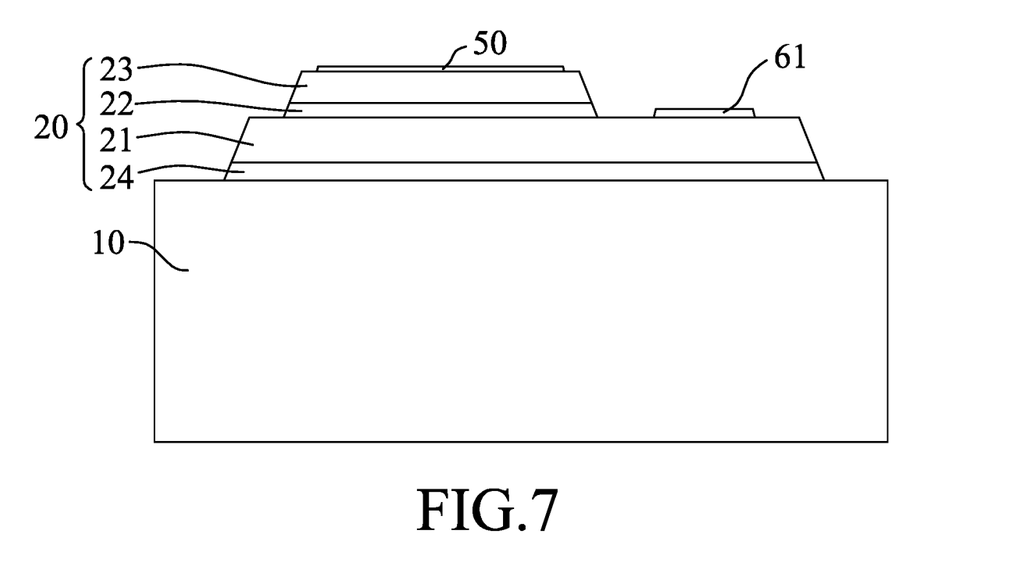

With reference to FIG. 7, a fifth process step (5) is implemented, in which the first contact layer 50 is deposited on the second conductivity type semiconductor layer 23, and the second conductivity type semiconductor layer 23 includes a P-type GaN layer that forms an ohmic contact with the first contact layer 50.

Figure 8:
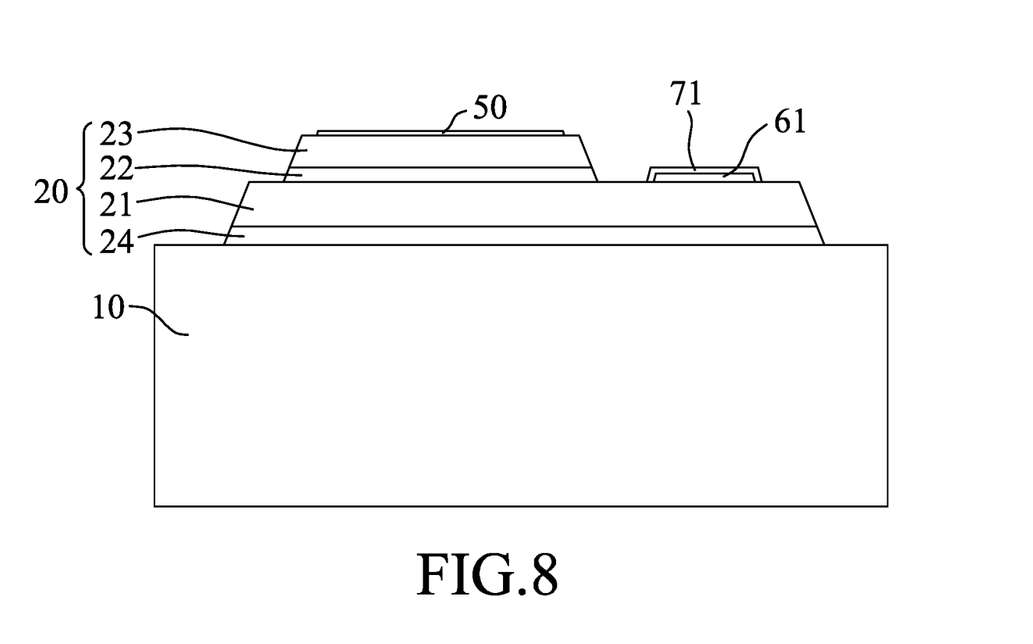

With reference to FIG. 8, a sixth process step (6) is implemented, in which the first connecting electrode 71 is formed on the second contact layer 61.

Figure 9:
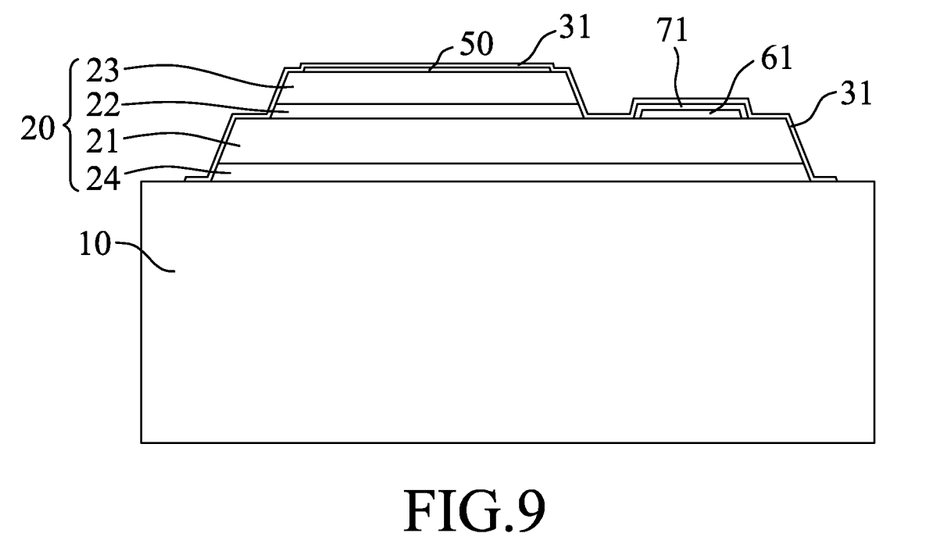

With reference to FIG. 9, a seventh process step (7) is implemented, in which a plasma enhanced chemical vapor deposition (PECVD) is used to deposit the first insulating layer 31 ($SiO_2$ layer, 4000 Å) on the semiconductor stack 20 to cover the semiconductor stack 20, the first contact layer 50 and the first connecting electrode 71.

Figure 10:
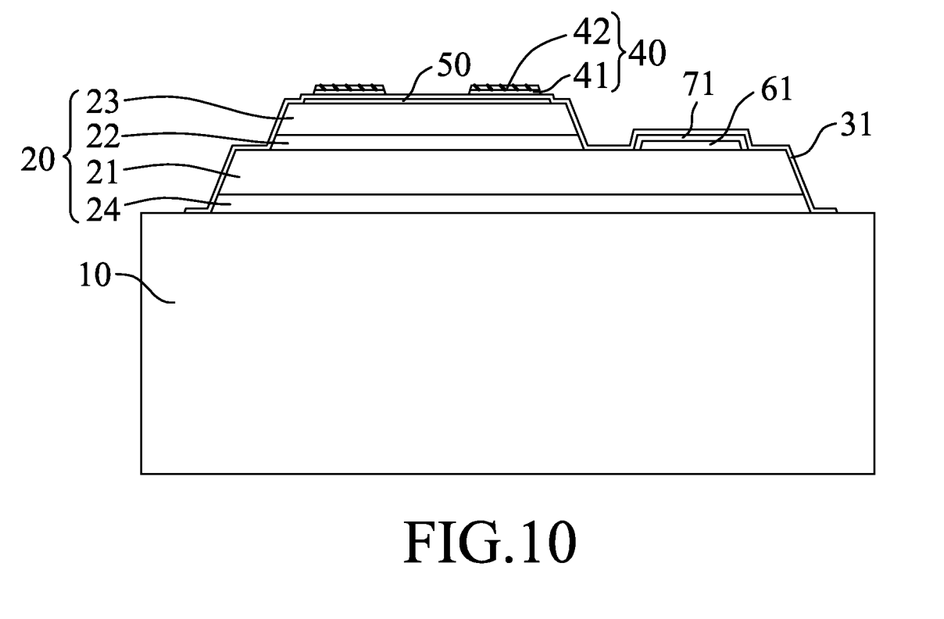

With reference to FIG. 10, an eighth process step (8) is implemented, in which a photolithography is used to define a vapor deposition area on the first insulating layer 31, and a vapor deposition machine is used to sequentially form the metal reflective layer 41 (Al layer) on the first insulating layer 31 in the vapor deposition area and the anti-oxidation layer 42 (Cr layer) on the metal reflective layer 41.

Figure 11:
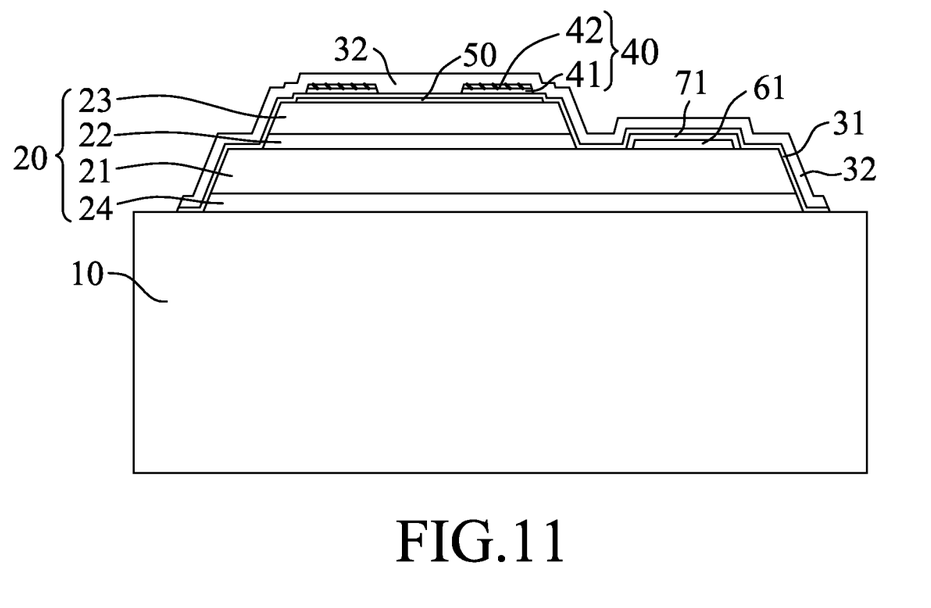

With reference to FIG. 11, a ninth process step (9) is implemented, in which the PECVD is used again to deposit the second insulating layer 32 ($SiO_2$ layer, 10000 Å) on the first insulating layer 31 to cover the first insulating layer 31, the metal reflective layer 41 and the anti-oxidation layer 42.

Figure 12:
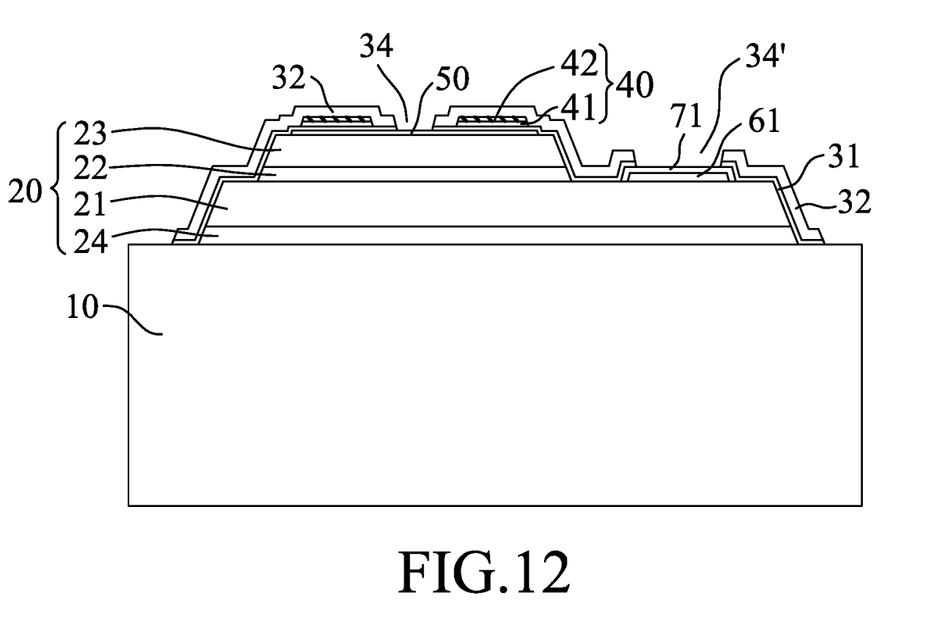

Referring to FIG. 12, a tenth process step (10) is implemented, in which the first insulating layer 31 and the second insulating layer 32 are wet-etched to form the through hole 34 so as to partially expose the first contact layer 50 and to form a through hole 34' so as to partially expose the first connecting electrode 71. In certain embodiments, the light emitting device may include a plurality of the through holes 34' and a plurality of the first connecting electrodes 71, and each first connecting electrode 71 is exposed through a respective one of the through holes 34'.

Figure 13:
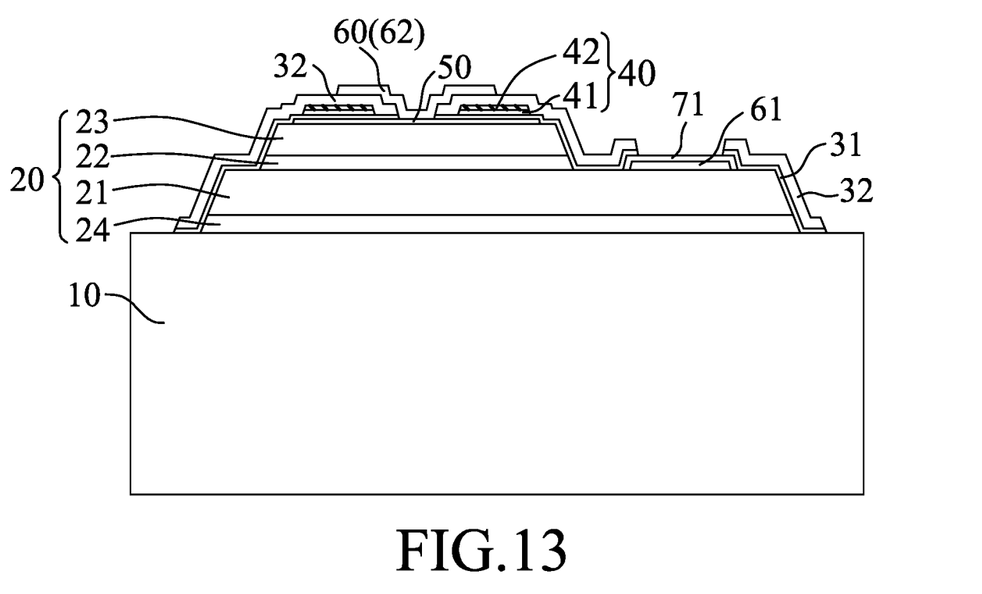

Referring to FIG. 13, an eleventh process step (11) is implemented, in which the second connecting electrode 62 is deposited on the second insulating layer 32 by using an evaporation machine. The second connecting electrode 62 extends into the through hole 34 to contact the first contact layer 50.

Figure 14:
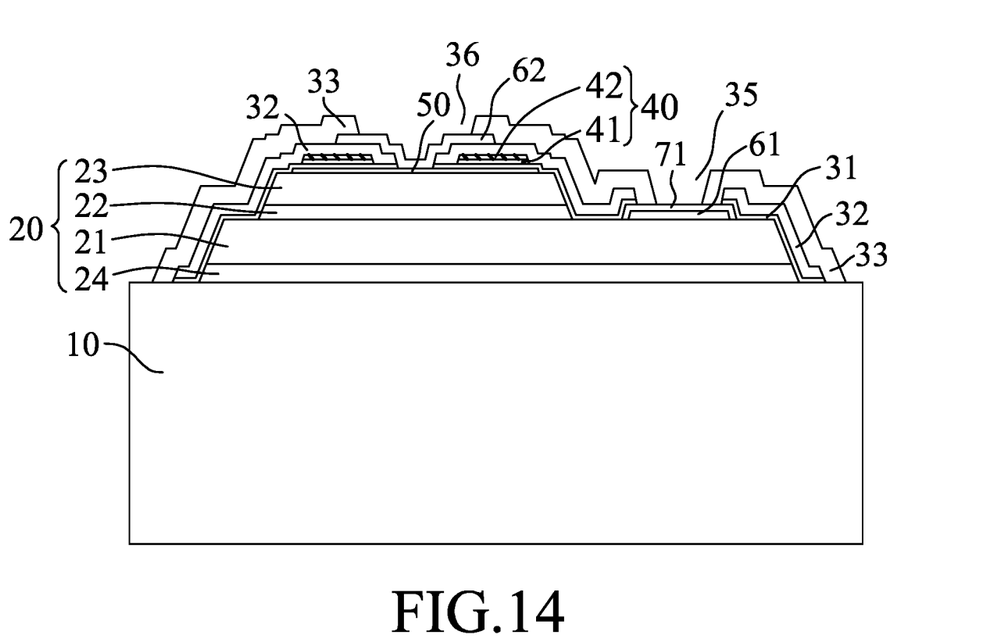

With reference to FIG. 14, a twelfth process step (12) is implemented, in which the third insulating layer 33 is further deposited on the above-mentioned structure shown in FIG. 12 so as to partially expose the first connecting electrode 71 through the first space 35 and to partially expose the second connecting electrode 62 through the second space 36 and so as to protect the sidewall of the semiconductor stack 20.

Figure 15:
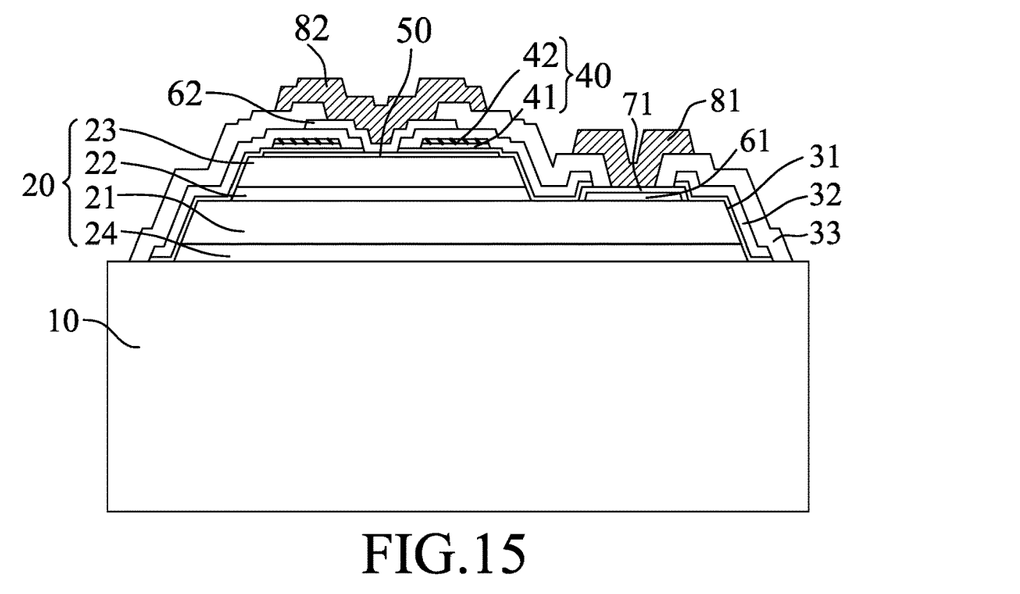

With reference to FIG. 15, a thirteenth process step (13) is implemented, in which the positions of the first and second pad electrodes 81, 82 are defined by the photolithography, and the first and second pad electrodes 81, 82 are formed on the positions successively.

A fourteenth process step (14) is implemented, in which the substrate 10 is cut to specified sizes using laser cutting and scribing processes so as to obtain the light emitting device as shown in FIG. 2.

Figure 16:
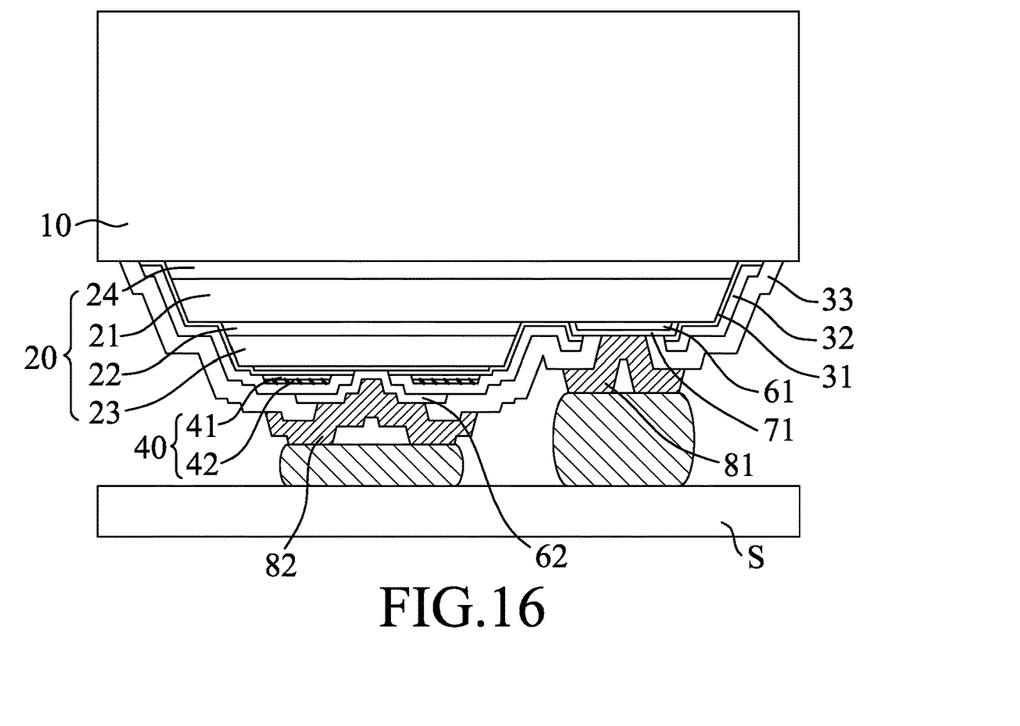

With reference to FIG. 16, a fifteenth process step (15) is implemented, in which a back surface of the sapphire substrate 10 faces upward, and the first and second pad electrodes 81, 82 of the light emitting device are bonded to a heat dissipating substrate (S) using a solder paste or gold-tin eutectic bonding. After a packaging process, a flip-chip light emitting diode package structure is obtained.

A light emitting apparatus is also provided in this disclosure, and includes the above-mentioned light emitting device.

Although this disclosure uses terms, such as substrate, upper surface, lower surface, semiconductor stack, first conductivity type semiconductor layer, light emitting layer, second conductivity type semiconductor layer, buffer layer, insulating layer, first insulating layer, second insulating layer, third insulating layer, reflective layer, metal reflective layer, anti-oxidation layer, contact layer, first connecting electrode, second connecting electrode, first pad electrode, second pad electrode, through hole, first space, second space, etc., the possibility of using other terms is not excluded. These terms are used only to conveniently describe and explain the essence of this disclosure, interpreting them as any kind of additional limitation is contrary to the spirit of this disclosure. The terms "first," "second," and the like in the description and claims of the embodiment of this disclosure and the above-mentioned accompanying drawings are used to distinguish similar items, and are not necessarily used to describe a specific order or a sequence order.

In the description above, for the purposes of explanation, numerous specific details have been set forth in order to provide a thorough understanding of the embodiment(s). It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects; such does not mean that every one of these features needs to be practiced with the presence of all the other features. In other words, in any described embodiment, when implementation of one or more features or specific details does not affect implementation of another one or more features or specific details, said one or more features may be singled out and practiced alone without said another one or more features or specific details. It should be further noted that one or more features or specific details from one embodiment may be practiced together with one or more features or specific details from another embodiment, where appropriate, in the practice of the disclosure.

While the disclosure has been described in connection with what is considered the exemplary embodiment, it is understood that this disclosure is not limited to the disclosed embodiment but is intended to cover various arrangements included within the spirit and scope of the broadest interpretation so as to encompass all such modifications and equivalent arrangements.

What is claimed is:

1. A light emitting device, comprising:
   a semiconductor stack including a first conductivity type semiconductor layer, a light emitting layer and a second conductivity type semiconductor layer that are stacked in sequence;
   an insulating layer partially covering said semiconductor stack; and
   a reflective layer disposed in said insulating layer and including a metal reflective layer and an anti-oxidation layer stacked one on top of the other,
   wherein said insulating layer includes a first insulating layer and a second insulating layer, said reflective layer having a lower surface in contact with said first insulating layer, and an upper surface opposite to said lower surface and in contact with said second insulating layer, and
   wherein said second insulating layer has a thickness greater than that of said first insulating layer.

2. The light emitting device as claimed in claim 1, wherein said anti-oxidation layer contains chromium (Cr).

3. The light emitting device as claimed in claim 1, wherein said anti-oxidation layer has a thickness ranging from 10 Å to 100 Å.

4. The light emitting device as claimed in claim 1, wherein said metal reflective layer contains one of aluminum (Al), silver (Ag), rhodium (Rh), and combinations thereof.

5. The light emitting device as claimed in claim 1, wherein said metal reflective layer has a thickness ranging from 500 Å to 10000 Å.

6. The light emitting device as claimed in claim 1, wherein said first insulating layer has a thickness ranging from 500 Å to 10000 Å, and said second insulating layer has a thickness ranging from 1000 Å to 30000 Å.

7. The light emitting device as claimed in claim 1, wherein each of said first insulating layer and said second insulating layer is made from one of silicon dioxide ($SiO_2$), aluminum oxide ($Al_2O_3$), silicon oxynitride (SiON), and magnesium fluoride ($MgF_2$).

8. The light emitting device as claimed in claim 1, further comprising a contact layer formed on said first conductivity type semiconductor layer.

9. The light emitting device as claimed in claim 8, further comprising a first connecting electrode located on said contact layer, said insulating layer partially covering said first connecting electrode.

10. The light emitting device as claimed in claim 1, wherein a projection of said reflective layer on said semiconductor stack is located in said second conductivity type semiconductor layer.

11. The light emitting device as claimed in claim 8, further comprising a second connecting electrode, said insulating layer having at least one through hole extending therethrough, said second connecting electrode extending into said at least one through hole and being electrically connected to said second conductivity type semiconductor layer.

12. The light emitting device as claimed in claim 11, wherein a projection of said reflective layer on said semiconductor stack does not overlap with said at least one through hole.

13. The light emitting device as claimed in claim 11, wherein said at least one through hole includes a plurality of through holes, each of said through holes having a diameter ranging from 10 μm to 50 μm, a distance between two adjacent ones of said through holes ranging from 10 μm to 100 μm.

14. The light emitting device as claimed in claim 11, further comprising:
a third insulating layer formed on said second connecting electrode and defining a first space and a second space;
a first pad electrode disposed in said first space and electrically connected to said contact layer; and
a second pad electrode disposed in said second space and electrically connected to said second connecting electrode.

15. A light emitting apparatus comprising said light emitting device as claimed in claim 1.

16. The light emitting apparatus as claimed in claim 15, wherein said anti-oxidation layer contains chromium (Cr).

17. The light emitting device as claimed in claim 15, wherein said metal reflective layer contains one of aluminum (Al), silver (Ag), rhodium (Rh), and combinations thereof.

18. A light emitting device, comprising:
a semiconductor stack including a first conductivity type semiconductor layer, a light emitting layer and a second conductivity type semiconductor layer that are stacked in sequence;
an insulating layer partially covering said semiconductor stack;
a reflective layer disposed in said insulating layer and including a metal reflective layer and an anti-oxidation layer stacked one on top of the other;
a contact layer formed on said first conductivity type semiconductor layer; and
a first connecting electrode located on said contact layer, said insulating layer partially covering said first connecting electrode.

19. A light emitting device, comprising:
a semiconductor stack including a first conductivity type semiconductor layer, a light emitting layer and a second conductivity type semiconductor layer that are stacked in sequence;
an insulating layer partially covering said semiconductor stack; and
a reflective layer disposed in said insulating layer and including a metal reflective layer and an anti-oxidation layer stacked one on top of the other,
wherein a projection of said reflective layer on said semiconductor stack is located in said second conductivity type semiconductor layer.

* * * * *